(12) United States Patent
Nasu

(10) Patent No.: US 7,869,245 B2
(45) Date of Patent: Jan. 11, 2011

(54) SEMICONDUCTOR STORAGE DEVICE WITH FIRST AND SECOND PADS ARRANGED IN PROXIMITY WITH FIRST TO FOURTH OUTPUT TRANSISTORS FOR REDUCING AN EXCESS REGION

(75) Inventor: Nobutaka Nasu, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 311 days.

(21) Appl. No.: 11/938,913

(22) Filed: Nov. 13, 2007

(65) Prior Publication Data
US 2008/0130344 A1 Jun. 5, 2008

(30) Foreign Application Priority Data
Dec. 5, 2006 (JP) ............... 2006-328369

(51) Int. Cl.
*G11C 5/06* (2006.01)
(52) U.S. Cl. .................. 365/72; 365/63; 365/51; 365/206
(58) Field of Classification Search .................. 365/51, 365/72, 63, 189.05, 206
See application file for complete search history.

(56) References Cited

U.S. PATENT DOCUMENTS

| 7,158,397 | B2 * | 1/2007 | Rinerson et al. | 365/63 |
| 7,307,871 | B2 * | 12/2007 | Liaw | 365/154 |
| 2004/0141352 | A1 * | 7/2004 | Dufourt et al. | 365/72 |

FOREIGN PATENT DOCUMENTS

| JP | 07-202145 | 8/1995 |
| JP | 08-017965 | 1/1996 |
| JP | 08-316436 | 11/1996 |

* cited by examiner

*Primary Examiner*—Andrew Q Tran
(74) *Attorney, Agent, or Firm*—Studebaker & Brackett PC; Donald R. Studebaker

(57) ABSTRACT

An excess region on a chip plane is eliminated to reduce a chip size. A plurality of data pads, which input/output data, are arranged near one side of an outer periphery of a substrate in parallel with the aforementioned one side, and a plurality of data pads, which input/output data, are arranged on an inner side of the plurality of data pads in parallel with the plurality of data pads. NMOSs, which output data, are arranged between the data pads, and PMOSs, which output data, are arranged at positions where they face the NMOSs near the data pads.

12 Claims, 4 Drawing Sheets

US 7,869,245 B2

SEMICONDUCTOR STORAGE DEVICE WITH FIRST AND SECOND PADS ARRANGED IN PROXIMITY WITH FIRST TO FOURTH OUTPUT TRANSISTORS FOR REDUCING AN EXCESS REGION

CROSS REFERENCE TO RELATED DOCUMENTS

This application claims priority under 35 U.S.C §119 to Japanese Patent Application Ser. No. 2006328369 filed Dec. 5, 2006, the entire disclosure of which is hereby incorporated by reference herein.

BACKGROUND OF THE INVENTION

1. Field of the Invention

The present invention relates to a semiconductor storage device, e.g., a dynamic random access memory (which will be referred to as a "DRAM" hereinafter) accommodated in a system in package (which will be referred to as an "SiP" hereinafter). For example, the present invention relates to a layout structure of data input/output pads associated with a plurality of bits, power supply pads, input/output control circuits which control over, e.g., writing/reading data, and others.

2. Description of the Related Art

Prior art examples including a layout of a semiconductor storage devices having data pads associated with a plurality of bits are shown in Japanese Patent Application Laid-open No. 202145-1995 and Japanese Patent Application Laid-open No. 316436-1996.

Japanese Patent Application Laid-open No. 202145-1995 discloses a semiconductor integrated circuit device in which an output block is arranged between a bonding pad on an outer peripheral side and an external region to eliminate an excess region and a chip size is thereby reduced. Further, Japanese Patent Application Laid-open No. 316436-1996 discloses a semiconductor storage device in which sources of two N channel MOS transistors (which will be referred to as "NMOSs" hereinafter) adjacent to each other are connected in common and an area occupied the NMOSs on a chip is reduced to decrease a chip size.

FIG. 2 is a schematic layout chart showing an example of a conventional semiconductor storage device disclosed, for example, in Japanese Patent Application Laid-open No. 202145-1995 and Japanese Patent Application Laid-open No. 316436-1996. The semiconductor storage device has a chip-like shape and includes a substantially square substrate 10. A memory array section 11 which stores data is arranged on the substrate 10 near one side of an outer periphery. This memory array section 11 is constituted of a plurality of memory cells, and entirely has a substantially square shape having a lateral width of L1 and a vertical width of L2. A plurality of data pads 12 (=12-1 to 12-n) which input/output data are arranged near one side facing the memory array section 11 in parallel with this side.

Each of the plurality of data pads 12 has a substantially square shape and is connected with a non-illustrated external circuit which controls a semiconductor storage device through a data wire 15. Furthermore, the plurality of data pads 12 are connected with a plurality of input/output control circuits 13 (=13-1 to 13-n) arranged on an inner side of the plurality of data pads 12 via signal wiring lines 16 through which data is transmitted in parallel with the plurality of data pads 12.

The plurality of input/output control circuits 13 are circuits which control input data, write the data in the memory array section 11 via signal wiring lines 17, and control and output the read data from the memory array section 11 through the signal wiring lines 17, and have complementary MOS transistors (which will be referred to as "CMOSs" hereinafter) constituted of non-illustrated output NMOSs and P channel MOS transistors (which will be referred to as "PMOSs" hereinafter). The plurality of input/output control circuits 13 are connected with the memory array section 11 through the signal wiring liens 17, and also connected with power supply pads 14-1 and 14-2 via power supply wiring lines 18 through which power is supplied.

Each of the power supply pads 14-1 and 14-2 is a terminal which receives power from an external power supply, has a substantially square shape, and is arranged alone one side near the plurality of data pads 12. Moreover, the power supply pads 14-1 and 14-2 are connected with power supply voltage terminals VDD and VSS of a non-illustrated external power supply through power supply wires 19.

An operation of the semiconductor storage device depicted in FIG. 2 will now be explained. Data is input to the plurality of input/output control circuits 13 from the non-illustrated external circuit which controls the semiconductor storage device through the plurality of data pads 12. The input data is controlled by the input/output control circuits 13 to be written in the memory array section 14. The written data is read out by the input/output control circuits 13. The read data is outputted to a non-illustrated external circuit, e.g., a CPU through the data pads 12.

However, the semiconductor storage device shown in FIG. 2 has the following disadvantage. A layout side of the memory array section 11 can be reduced based on miniaturization in a semiconductor manufacturing process. However, in regard to the data pads 12 to be wire-bonded, a pad pitch which indicates a distance between the data pads 12-1 and 12-2 cannot be reduced because of a mechanical limitation of a wire bonding device.

In order to solve this problem, the technology disclosed in Japanese Patent Application Laid-open No. 202145-1995, for example, provides a structure where the plurality of data pads 12 are constituted on two stages on an outer peripheral side and an inner peripheral side to reduce a lateral width of a pad forming region 12S is considered. However, when the data pads 12 are constituted on the two stages, a vertical width of the pad forming region 12S is doubled, and a chip size is increased. In order to reduce the chip size, a decreased distance between the data pads 12 and the input/output control circuits 13 can be considered.

However, although the distance between the data pads 12 on the outer peripheral side and the input/output control circuits 13 can be reduced by utilizing an excess region, the distance between the data pads 12 on the inner peripheral side and the input/output control circuits 13 is hard to reduce since the excess region is not present. Additionally, when the distance between the data pads 12 and the input/output control circuits 13 is small, there is a problem that electrical characteristics of the input/output control circuits 13 are degraded due to noise from the data pads 12. Therefore, there exists a need to address the above-explained difficulties in the art.

SUMMARY OF THE INVENTION

The foregoing needs are met, to a great extent, by the present invention, wherein in one aspect a semiconductor storage device is provided that in some embodiments provides: a memory array section which is arranged on a substantially square substrate and constituted of a plurality of memory cells which store data; a plurality of first pads arranged near one side of an outer periphery of the substrate in parallel with the one side; a plurality of second pads which are arranged on an inner side of the plurality of first pads in parallel with the plurality of first pads; a plurality of first output transistors which are respectively arranged near the plurality of first pads and respectively output data read from the memory array section to the plurality of first pads; and a plurality of second output transistors which are respectively arranged near the plurality of second pads and respectively output the data read from the memory array section to the plurality of second pads.

Each one of the plurality of first output transistors is formed of a first transistor which is of a first electroconductive type and a second transistor which is of a second electroconductive type. Each one of the plurality of the second output transistors is formed of a third transistor which is of the first electroconductive type and a fourth transistor which is of the second electroconductive type.

According to the semiconductor storage device of the present invention, the plurality of second pads are arranged on the inner side of the plurality of first pads in parallel with the plurality of first pads, and the first transistor, the second transistor, the third transistor, and the fourth transistor are arranged near each plurality of first pads and each plurality of second pads. As a result, an excess region can be eliminated to reduce a chip size.

In accordance with another embodiment of the present invention, a method of reducing an excess region on a semiconductor storage device is provided that in some embodiments includes arranging a memory array section on a substrate and arranging a plurality of first pads near one side of an outer periphery of the substrate in parallel with the one side. The method may further include arranging a plurality of second pads on an inner side of the plurality of first pads in parallel with the plurality of first pads and providing a plurality of first output transistors constituted of a first complementary transistor formed of a first transistor which is of a first electroconductive type and a second transistor which is of a second electroconductive type. Additionally, the method may include providing a plurality of second output transistors constituted of a second complementary transistor formed of a third transistor which is of the first electroconductive type and a fourth transistor which is of the second electroconductive type. The plurality of first output transistors may be respectively arranged near the plurality of first pads. Also, the plurality of second output transistors may be respectively arranged near the plurality of second pads.

In accordance with yet another embodiment of the present invention, a semiconductor storage system is provided that in some embodiments includes a means a pad forming region for receiving a plurality of data pads and one or more input output circuits connected to the plurality of data pads. The system may further including a means for reducing a lateral width of the pad forming region for receiving a plurality of data pads and a means for eliminating an excess region between the plurality of data pads. A means for reducing a pad pitch of the plurality of data pads with respect to one or more input output circuits may also be provided.

These and other objects and novel features of the invention will be more fully apparent when the description of the following preferred embodiments are read in conjunction with the accompanying drawings. It is to be noted that the drawings are only illustrative and are not intended to limit the scope of this invention.

DETAILED DESCRIPTION OF THE PREFERRED EMBODIMENTS

Disclosed embodiments of a semiconductor storage device may include: a memory array section which is arranged on a substrate and stores data; a plurality of first pads arranged along one side of an outer periphery of the substrate; a plurality of second pads arranged on an inner side of the plurality of first pads in parallel with the plurality of first pads; a plurality of second pads arranged on an inner side of the plurality of first pads in parallel with the plurality of first pads; a plurality of first transistors respectively arranged near the plurality of first pads; a plurality of second transistors arranged at positions where they face the plurality of first transistors; a plurality of third transistors respectively arranged near the plurality of second pads; and a plurality of fourth transistors arranged at positions where they face the plurality of second transistors with respect to the plurality of third transistors.

Embodiment 1

Structure of Embodiment 1

Figure 1A:
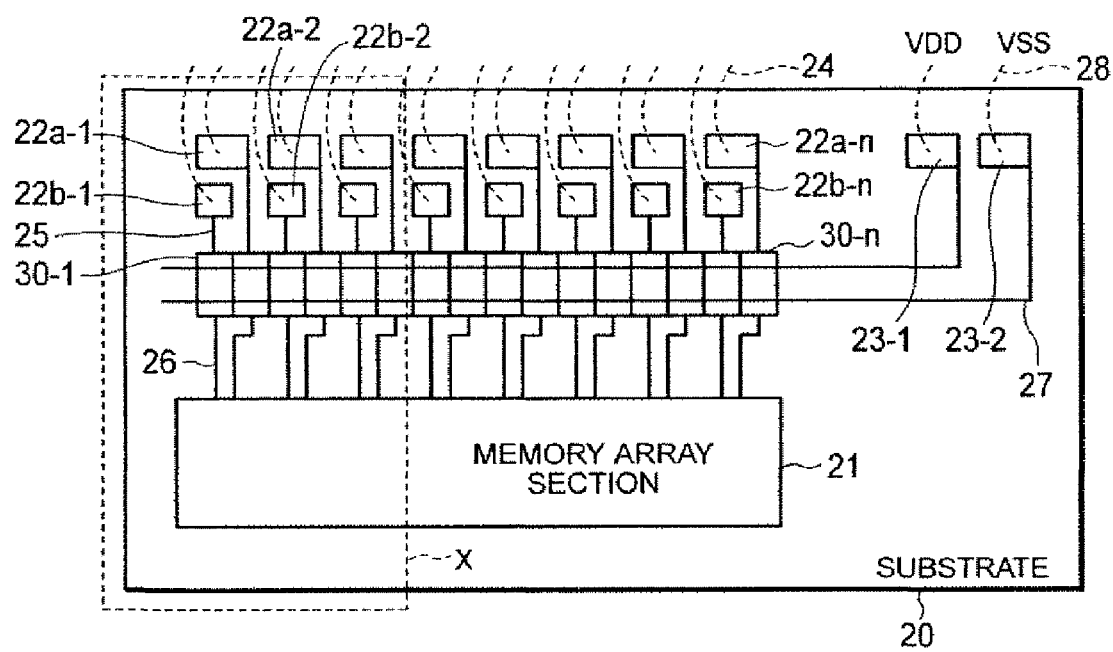
FIGS. 1A-1B are a schematic layout chart showing a semiconductor storage device according to an exemplary embodiment of the present invention.
Figure 1B:
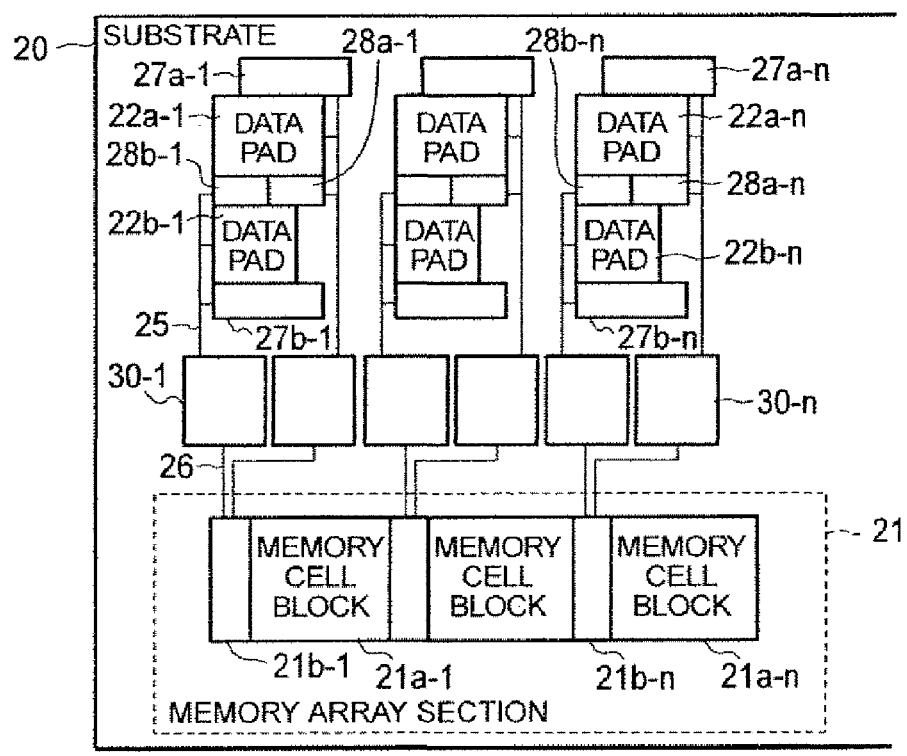
Figure 2:
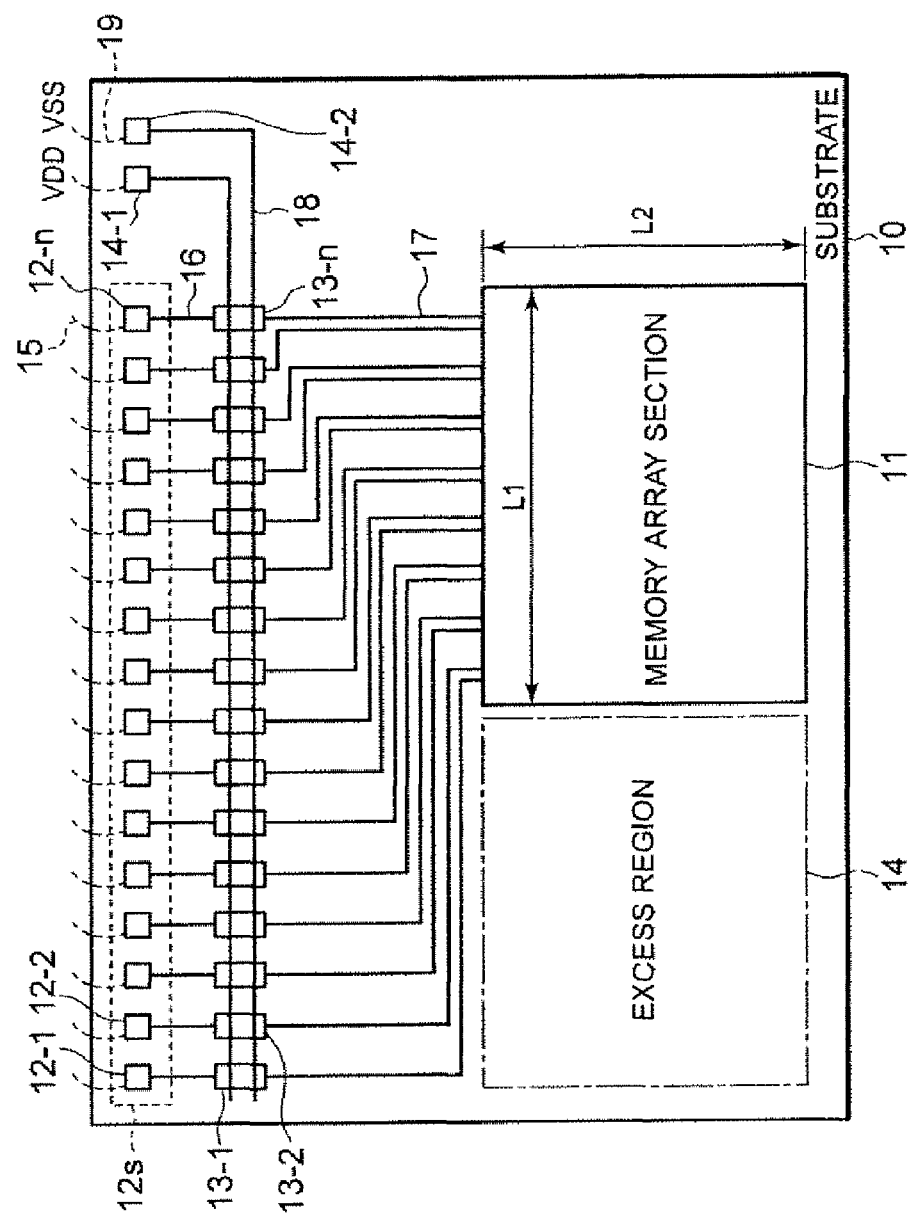
FIG. 2 is a schematic layout chart showing an example of a conventional semiconductor storage device.

FIGS. 1A and 1B are schematic layout charts showing a semiconductor storage device in Embodiment 1 according to the present invention. FIG. 1A is a view showing the entire semiconductor storage device, and FIG. 1B is an enlarged view of a part X.

This semiconductor storage device is constituted of, e.g., a DRAM, and entirely has a chip-like shape, and has a substantially square substrate 20. A memory array section 21 which stores data is arranged near one side of an outer periphery on the substrate 20. This memory array section 21 has a substantially square shape, and is constituted of memory cell blocks 21a (=21a-1 to 21a-n) which store data and sub-array blocks 21b (=21b-1 to 21b-n) which select the memory cell blocks 21a based on address information. Although aspects of disclosed embodiments are described and illustrated as having a pre-selected shape, such as a substantially square shape, such descriptions are for illustrative purposes and are not meant to limit the invention. Accordingly, skilled artisans will appreciate that other suitable shape designs may be utilized for use with the disclosed semiconductor storage device described herein.

Although the illustration of an internal structure of the sub-array block 21b is omitted, the sub-array block 21b has a row address decoder which selects the memory cell block 21a based on row address information, a column address decoder which selects the memory cell block 21a based on column address information, a sense amplifier which amplifies data stored in the memory cell block 21a to a logical level to be output, and others. Furthermore, the sub-array blocks 21b are connected with a plurality of input/output control circuits 30

(=30-1 to 30-*n*) arranged along the memory array section 21 via signal wiring lines 26 through which data is transmitted.

Each of the plurality of input/output control circuits 30 controls input data, writes the data in the memory array section 11, and controls and writes the data read from the memory array section 11. The plurality of input/output control circuits 30 are connected to first pads (e.g., data pads) 22*a* (=22*a*-1 to 22*a*-*n*), to second pads (e.g., data pads) 22*b* (=22*b*-1 to 22*b*-*n*) via signal wiring lines 25, and to power supply pads 23-1 and 23-2 via power supply wiring lines 27.

The plurality of data pads 22*a* are arranged near one side facing the memory array section 21 in parallel with the aforementioned side. Each data pad 22*a* has an area, for example, a substantially rectangular shape, to provide a margin to a bonding position of a wire bonding. The plurality of data pads 22*a* serve as terminals which are connected with first transistors (e.g., PMOSs) 27*a* (=27*a*-1 to 27*a*-*n*) and second transistors (e.g., NMOSs) 28*a* (=28*a*-1 to 28*a*-*n*) via the signal wiring lines 25. Data pads 22*a* may input or output data with respect to a non-illustrated external circuit of the semiconductor storage device through data wires 24.

The plurality of data pads 22*b* are arranged on an inner side of the plurality of data pads 21*a* in parallel with the plurality of data pads 21*a*. Each data pad 22*b* has a substantially square shape, and inputs/outputs data with respect to a non-illustrated external device which controls the semiconductor storage device through the data wires 24. The plurality of data pads 22*b* are connected to third transistors (e.g., PMOSs) 27*b* (=27*b*-1 to 27*b*-*n*) and fourth transistors (e.g. NMOSs) 28*b* (=28*b*-1 to 28*b*-*n*) through the signal wiring lines 25.

NMOS elements 28*a* and 28*b* are arranged between data pads 22*a* and 22*b* and are connected via signal wiring lines 25 to output data. PMOS elements 27*a* and 27*b* are arranged at positions facing NMOSs 28*a* and 28*b* near data pads 22*a* and 22*b* and are connected with the signal wiring lines 25 to output data. The PMOSs 27*a* and 27*b* have shapes larger than those of the NMOSs 28*a* and 28*b*, because they are driven with the same voltage as that of the NMOSs 28*a* and 28*b* and thereby have a long channel length.

The power supply pads 23-1 and 23-2 are terminals which receive power from an external power supply, have a substantially square shape, and are arranged along one side near the plurality of data pads 22*a*. Power supply voltage terminals VDD and VSS of a non-illustrated external power supply are connected with the power supply pads 23-1 and 23-2 through power supply wires 28.

Figure 3A:
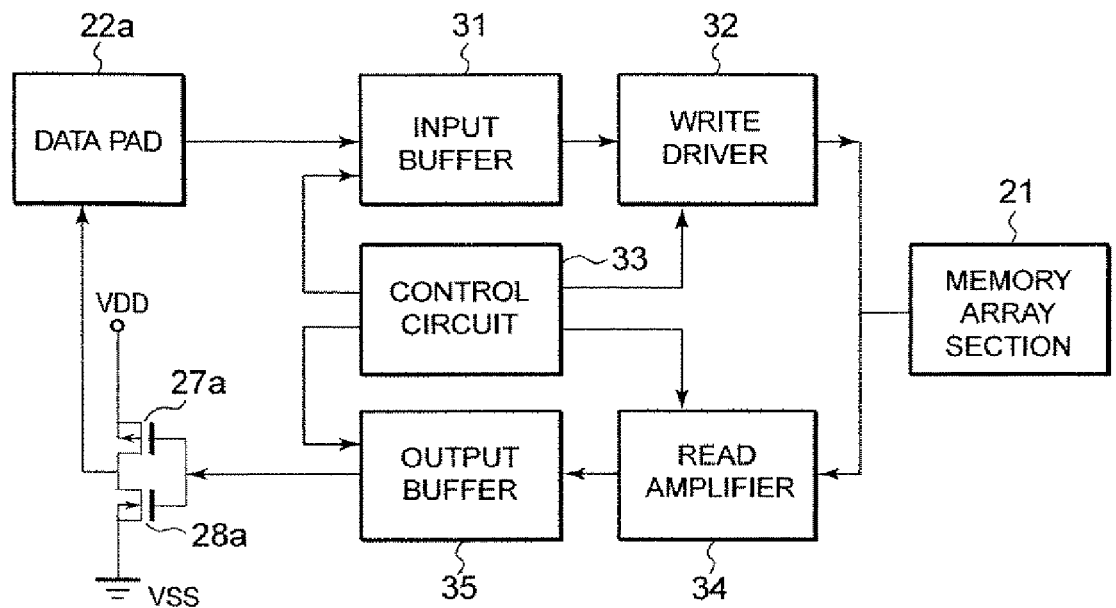
FIGS. 3A-3B are a view showing an input/output control circuit 30 depicted in FIG. 1.
Figure 3B:
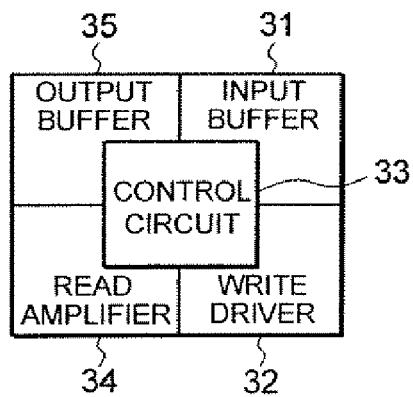

FIGS. 3A and 3B are views showing the input/output control circuit 30 depicted in FIG. 1 implemented in exemplary circuit configurations. FIG. 3A is a view showing an outline circuit configuration of the input/output control circuit 30 of FIG. 1. FIG. 3B is a view showing an outline layout of the input/output control circuit 30 of FIG. 1.

The input/output control circuit 30 of FIG. 1 has a control circuit 33 (shown in FIGS. 3A and 3B) which outputs a control signal. This control circuit 33 is connected with an input buffer 31, a write driver 32, a read amplifier 34, and an output buffer 35, and these members are arranged at the center of the input/output control circuit 30. The input buffer 31 serves as a circuit which holds data input from the data pad 22*a* based on the control signal. The write driver 32 is connected to the input buffer 31 on an output side and is arranged on the data pad 22*a* side. The write driver 32 is a circuit which drives the data held in the input buffer 31 to write this data in the memory array section 21 based on the control signal. The write driver 32 is arranged between the input buffer 31 and the memory array section 21.

The read amplifier 34 is a circuit which reads, amplifies, and outputs data stored in the memory array section 21 based on the control signal. The read amplifier 34 has the output buffer 35 connected thereto on an output side and is arranged at a position where it faces the input buffer 31. The output buffer 35 is a circuit which holds the data read from the memory array section 21 based on the control signal. The output buffer 35 has the PMOS 27*a*, the PMOS 27*b*, the NMOS 28*a*, and the NMOS 28*b* connected thereto on an output side and is arranged at a position where it faces the write driver 32.

Operation of Embodiment 1

Data is inputted to the plurality of input/output control circuits 30 from the non-illustrate external circuit which controls the semiconductor storage device via the plurality of data pads 22*a* and 22*b*. The input data is held in each input buffer 31 based on a control signal. The held data is driven by each write driver 32 to be outputted to the memory array section 21 based on the control signal. The output data is written and stored in the memory cell block 21*a* selected by the row address decoder and the column address decoder in the memory array section 21 based on address information.

The stored data is amplified and read by each read amplifier 34 based on the control signal. The read data is held in each output buffer 35 based on the control signal. The held data is outputted to the PMOS 27*a*, the PMOS 27*b*, the NMOS 28*a*, and the NMOS 28*b* based on the control signal. When the output data is "L", the PMOSs 27*a* and 27*b* enter an ON state and this data is output to the data pads 22*a* and 22*b*. When the data is "H", the NMOSs 28*a* and 28*b* enter the ON state and this data is not output.

Effects of Embodiment 1

According to the semiconductor storage device of Embodiment 1, since the plurality of data pads 22*b* which input/output data are arranged on the inner side of the plurality of data pads 22*a* in parallel with the plurality of data pads 31 and the PMOS 36*a*, the PMOS 36*b*, the NMOS 37*a*, and the NMOS 37*b* are arranged near the respective data pads 22*a* and 22*b*, the following effects (A) to (D), as described herein, can be obtained.

(A) A lateral width of a pad forming region where the data pads 22*a* or 22*b* are formed can be reduced. Therefore, an excess region is eliminated, thereby reducing a chip size.

(B) Since the NMOSs 28*a* and 28*b* are arranged between the plurality of data pads 22*a* and the plurality of data pads 22*b*, an excess region between the plurality of data pads 22*a* and the plurality of data pads 22*b* is eliminated, and a pad pitch of the plurality of data pads 22*a* and the input output circuits 30 can be reduced, thereby decreasing the chip size.

(C) The wiring line between each input/output control circuit 30 and the memory array section 35 is shortened, and a resistance value of the wiring line is lowered, thereby increasing a data transfer rate.

(D) Since the PMOS 36*a*, the PMOS 36*b*, the NMOS 37*a*, and the NMOS 37*b* are arranged apart from each input/output control circuit 30, an influence of noise can be reduced.

Embodiment 2

Structure of Embodiment 2

Figure 4:
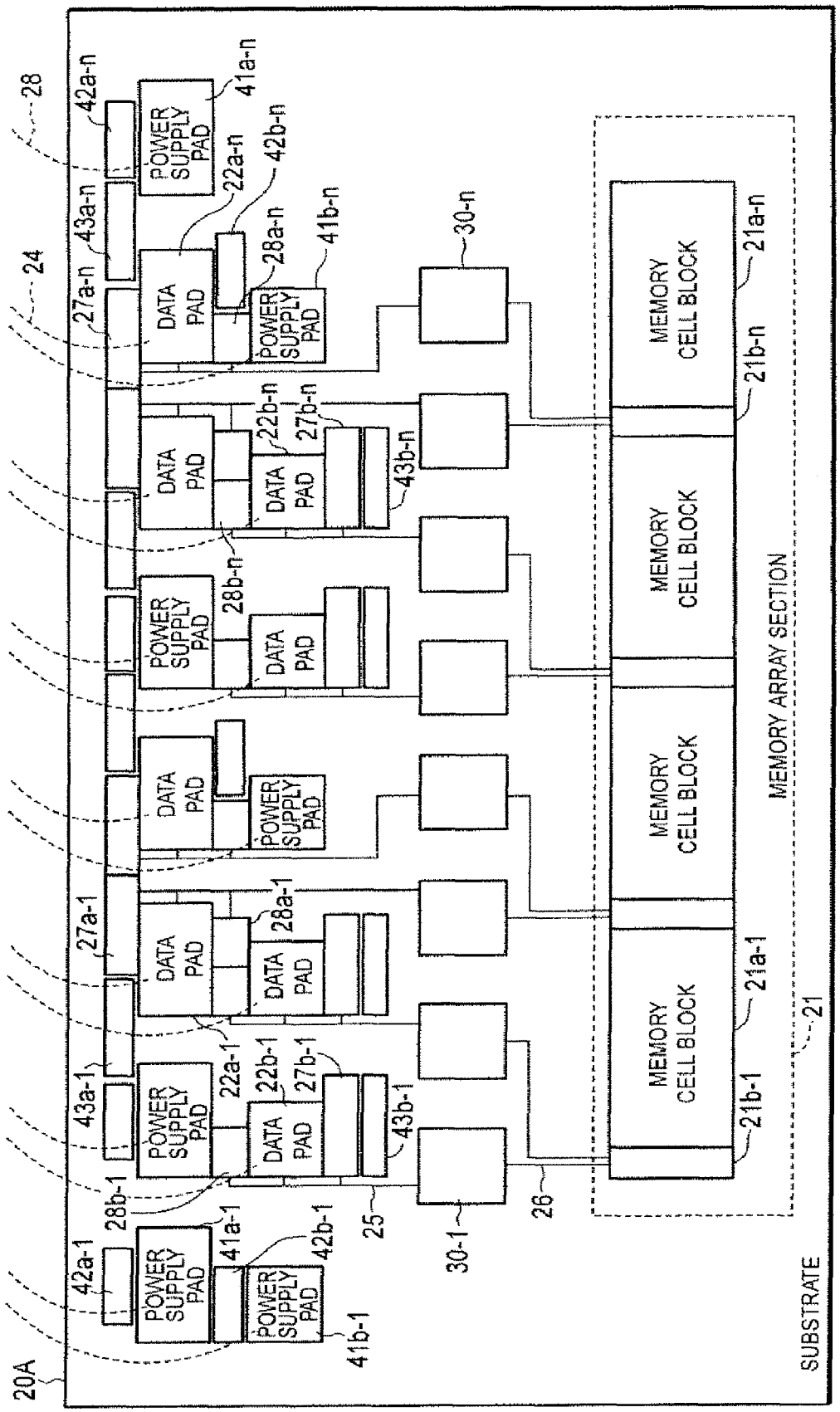
FIG. 4 is a schematic layout chart showing a semiconductor storage device according to another exemplary embodiment of the present invention.

FIG. 4 is a schematic layout chart showing a semiconductor storage device in Embodiment 2 according to the present invention, and like reference numerals denote elements equal to those in FIG. 1 showing Embodiment 1.

This semiconductor storage device is constituted of, e.g., a DRAM, entirely has a chip-like shape, and includes a substrate 20A different from the substrate 20 according to Embodiment 1. As different from Embodiment 1, on the substrate 20A are provided a plurality of power supply pads 41a (=41a-1 to 41a-n) and a plurality of power supply pads 41b (=41b-1 to 41b-n) in place of the power supply pads 23-1 to 23-2, and also provided a plurality of electrostatic discharge protection elements (which will be referred to as "ESDs" hereinafter) 42a (=42a-1 to 42a-n), ESDs 42b (=42b-1 to 42b-n), ESDs 43a (=43a-1 to 43a-n), and ESDs 43b (=43b-1 to 43b-n).

The plurality of power supply pads 41a are arranged in such a manner that two data pads 31a are arranged between the respective power supply pads 41a, and each power supply pad 41a has a substantially rectangular shape to provide a margin to a bonding position of a wire bonding. This power supply pad 41a is a terminal which receives power from an external power supply, and it is connected with a power supply voltage terminal of the non-illustrated external power supply via a power supply wire 28 and also connected with a PMOS 36a, an NMOS 37a, the ESD 42a, and an input/output control circuit 30.

The plurality of power supply pads 41b are arranged in such a manner that two data pads 31b are arranged between the respective power supply pads 41b and each power supply pad 41b is shifted in an arrangement direction of the plurality of power supply pads 41a and has a substantially square shape. This power supply pad 41b is a terminal which receives power from the external power supply, and it is connected with a power supply voltage terminal of the non-illustrated external power supply via the power supply wire 28 and also connected with a PMOS 36b, an NMOS 37b, an ESD 42b, and the input/output control circuit 30.

The ESDs 42a and 42b are elements which are arranged near the power supply pads 41a and 42b and protect the semiconductor storage device against static electricity. The ESDs 43a and 43h are elements which are arranged near the data pads 31a and 31b, connected with the data pads 31a and 31b, and protect the semiconductor storage device against static electricity.

Operation of Embodiment 2

An operation of the semiconductor storage device according to Embodiment 2 is the same as that of the semiconductor storage device according to Embodiment 1.

Effects of Embodiment 2

According to the semiconductor storage device according to Embodiment 2, since the plurality of power supply pads 41a and 42b are arranged between the plurality of data pads 31a and 31b and the ESDs 42a, 42b, 43a, and 43b are provided, the following effects can be obtained in addition to the effects of Embodiment 1.

Since the power supply wire 28, the data wire 24, the data wire 24, and the power supply wire 28 are drawn out in the same direction in the mentioned order, a mutual inductance between pieces of data can be reduced, and an effect of decreasing slowdown in output due to an inductance at the time of reverse data output can be obtained.

Further, providing the ESDs 42a, 42b, 43a, and 43b enables protecting the semiconductor device from static electricity.

(Modification)

The present invention is not restricted to Embodiments 1 and 2, and various use conformations and modifications can be carried out. As the use conformations or modifications, there are, e.g., the following examples (1) to (5).

(1) Although the example of the DRAM has been explained in Embodiments 1 and 2, the present invention can be applied to a semiconductor storage device such as a static random access memory.

(2) Although each of the data pads 31a and 31b and the power supply pads 41a and 41b has the rectangular shape or the square shape in Embodiments 1 and 2, a substantially square shape can suffice.

(3) In Embodiments 1 and 2, non-connected bonding dummy pads may be arranged near a side opposed to one side where the data pads 31a and 31b are arranged. When the bonding dummy pads are bonded, the chip can be prevented from being inclined at the time of bonding.

(4) Although the PMOS 36a, the PMOS 36b, the NMOS 37a, and the NMOS 37b are used as the output transistors in Embodiments 1 and 2, a CMOS may be used.

(5) Although the plurality of power supply pads 41b are arranged in such a manner that each power supply pad is shifted in the arrangement direction of the plurality of power supply pads 41a in Embodiment 2, each power supply pad 41b may be shifted in the opposite direction.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

I claim:

1. A semiconductor storage device having:
   a memory array section which is arranged on a substantially square substrate and constituted of a plurality of memory cells which store data;
   a plurality of first pads arranged near one side of an outer periphery of the substrate in parallel with the one side;
   a plurality of second pads which are arranged on an inner side of the plurality of first pads in parallel with the plurality of first pads;
   a plurality of first output transistors which are respectively arranged near the plurality of first pads and respectively output data read from the memory array section to the plurality of first pads; and
   a plurality of second output transistors which are respectively arranged near the plurality of second pads and respectively output the data read from the memory array section to the plurality of second pads,
   wherein each one of said plurality of first output transistors is constituted of a first complementary transistor formed of a first MOS transistor which is of a first electroconductive type and a second MOS transistor which is of a second electroconductive type, and each one of said plurality of second output transistors is constituted of a second complementary transistor formed of a third MOS transistor which is of the first electroconductive type and a fourth MOS transistor which is of the second electroconductive type, the second electroconductive type is opposite to the first electroconductive type.

2. The semiconductor storage device according to claim 1, wherein the first MOS transistor and the second MOS transistor are arranged at positions where they face the plurality of first pads, and the third MOS transistor and the fourth MOS transistor are arranged at positions where they face the plurality of second pads.

3. The semiconductor storage device according to claim 1 or 2, wherein each plurality of first pads and each plurality of second pads have sizes different from each other.

4. The semiconductor storage device according claim 1, wherein the plurality of second pads are arranged to be shifted in an arrangement direction of the plurality of first pads.

5. The semiconductor storage device according to claim 1, wherein the plurality of first pads are a plurality of data input/output first pads, and the plurality of second pads are a plurality of data input/output second pads, and
in the semiconductor storage device are provided a plurality of input/output control circuits which are arranged on an inner side of the plurality of second pads, to control writing input data into the memory array section from the plurality of first and second pads, and to control output of read data from the memory array section to the plurality of first and second output transistors.

6. The semiconductor storage device according to claim 1, wherein one or more first power supply pads are arranged between the plurality of first pads, and one or more second power supply pads are arranged between the plurality of second pads.

7. A method of reducing an excess region on a semiconductor storage device comprising:
arranging a memory array section on a substrate;
arranging a plurality of first pads near one side of an outer periphery of the substrate in parallel with the one side;
arranging a plurality of second pads on an inner side of the plurality of first pads in parallel with the plurality of first pads;
providing a plurality of first output transistors constituted of a first complementary transistor formed of a first MOS transistor which is of a first electroconductive type and a second MOS transistor which is of a second electroconductive type;
providing a plurality of second output transistors constituted of a second complementary transistor formed of a third MOS transistor which is of the first electroconductive type and a fourth MOS transistor which is of the second electroconductive type, the second electroconductive type is opposite to the first electroconductive type;
respectively arranging the plurality of first output transistors near the plurality of first pads; and
respectively arranging the plurality of second output transistors near the plurality of second pads.

8. The method according to claim 7, further comprising:
arranging the first MOS transistor and the second MOS transistor at positions where they face the plurality of first pads; and
arranging the third MOS transistor and the fourth MOS transistor at positions where they face the plurality of second pads.

9. The method according to claim 7 or 8, wherein each plurality of first pads and each plurality of second pads have sizes different from each other.

10. The method according to claim 7 further comprising:
shifting the plurality of second pads in an arrangement direction of the plurality of first pads.

11. The method according to claim 7, further comprising:
arranging a plurality of input/output control circuits on an inner side of the plurality of second pads.

12. The method according to claim 7, further comprising:
arranging one or more first power supply pads between the plurality of first pads; and
arranging one or more second power supply pads between the plurality of second pads.

* * * * *